US008037604B2

(12) United States Patent
Kanemoto
(10) Patent No.: US 8,037,604 B2
(45) Date of Patent: Oct. 18, 2011

(54) METHOD OF MANUFACTURING INK JET RECORDING HEAD

(75) Inventor: Kei Kanemoto, Suwa (JP)

(73) Assignee: Seiko Epson Corporation (JP)

( * ) Notice: Subject to any disclaimer, the term of this patent is extended or adjusted under 35 U.S.C. 154(b) by 180 days.

(21) Appl. No.: 12/407,043

(22) Filed: Mar. 19, 2009

(65) Prior Publication Data

US 2009/0237468 A1 Sep. 24, 2009

(30) Foreign Application Priority Data

Mar. 24, 2008 (JP) ................................ 2008-076376

(51) Int. Cl.

| | |
|---|---|
| ***B21D 53/76*** | (2006.01) |
| ***B23P 17/00*** | (2006.01) |
| ***H01L 41/22*** | (2006.01) |
| ***H04R 17/00*** | (2006.01) |
| ***H05K 3/02*** | (2006.01) |
| ***H05K 3/10*** | (2006.01) |
| ***B41J 2/015*** | (2006.01) |

(52) U.S. Cl. ........... 29/890.1; 29/25.35; 29/846; 347/20

(58) Field of Classification Search ................. 29/890.1, 29/25.35, 846; 347/20, 40, 44–45, 65, 68–70; 310/311, 316.01, 317

See application file for complete search history.

(56) References Cited

U.S. PATENT DOCUMENTS

| | | | | |
|---|---|---|---|---|
| 5,581,861 | A * | 12/1996 | Lee et al. | 29/25.35 |
| 6,378,996 | B1 * | 4/2002 | Shimada et al. | 347/70 |
| 6,502,930 | B1 * | 1/2003 | Shimada et al. | 347/71 |
| 7,381,341 | B2 * | 6/2008 | Shimada et al. | 216/27 |
| 7,631,427 | B2 * | 12/2009 | Silverbrook | 29/890.1 |
| 7,862,734 | B2 * | 1/2011 | McAvoy et al. | 216/27 |
| 2003/0142169 | A1 * | 7/2003 | Maeng et al. | 347/47 |
| 2007/0144003 | A1 * | 6/2007 | Silverbrook | 29/890.1 |

FOREIGN PATENT DOCUMENTS

| | | | |
|---|---|---|---|
| JP | 2000-062173 | * | 2/2000 |
| JP | 2000-289201 | | 10/2000 |
| JP | 2001-162794 | | 6/2001 |
| JP | 2001-205808 | * | 7/2001 |
| JP | 2001-205815 | | 7/2001 |
| JP | 2006-210896 | * | 8/2006 |

* cited by examiner

*Primary Examiner* — A. Dexter Tugbang
*Assistant Examiner* — David Angwin
(74) *Attorney, Agent, or Firm* — Harness, Dickey & Pierce, P.L.C.

(57) ABSTRACT

A method is provided for manufacturing an ink jet recording head including a reservoir to which ink is supplied from outside, a pressure generating chamber leading to the reservoir, and a nozzle orifice leading to the pressure generating chamber. According to the method, the ink jet recoding head is fabricated by conducting semiconductor processes such as a film forming step, a photolithography step, an etching step and the like, on a single substrate. Thus, there is no need for multiple substrates or adhesives.

6 Claims, 6 Drawing Sheets

METHOD OF MANUFACTURING INK JET RECORDING HEAD

BACKGROUND

1. Technical Field

The present invention relates to a method for manufacturing an ink jet recording head, an ink jet recording head and an ink jet recording device. The invention particularly relates to a method with which it does not need to joint substrates adhesively and it is possible to prevent a nozzle orifice from being blocked with adhesive.

2. Related Art

Referring to FIG. 10A, an ink jet recording head 200, which is an example of related art, has a piezoelectric element 201 (or piezo-element), a driver circuit 203 that drives the piezoelectric element, a sealing plate 205 that is used for sealing the piezoelectric element, a reservoir 207 to which an ink fluid is supplied from outside, a substrate 210 that has a vibrating plate 209 and a pressure generating chamber 211, and a nozzle plate 220 that has a nozzle orifice 213. Referring to FIG. 10B, the above-mentioned parts and components are assembled and bonded adhesively in the ink jet recording head 200. The piezoelectric element 201 is further coupled to the driver circuit 203 through wire-bonding.

In recent years, the nozzle orifices are highly densely arranged and it is getting harder to couple the piezoelectric element 201 and the driver circuit 203 by wire bonding and the bonding technique almost reaches to a technological limit for today's ink jet recording head. In order to tackle this problem, a manufacturing method that solves the problem has been disclosed. JP-A-2001-205815 is a first example of the related art and JP-A-2001-162794 is a second example of the related art. The examples disclose a method in which the driver circuit is directly formed on the substrate or the sealing plate. According to the method, the piezoelectric element and the driver circuit are coupled each other through a metal wiring line which is formed by using a photolithography technique, or coupled through flip-chip mounting thereby more minute distant coupling is possible compared with the wire bonding technique. Through such method, it is possible to accommodate the dense arrangements of the nozzle orifices.

However the methods disclosed by the first and second examples are developed on a condition that the substrates are adhesively bonded each other. More specifically, substrates on which elements are provided or processed are jointed and bonded therefore the manufacturing process becomes complicated and it is difficult to reduce a manufacturing cost. Moreover, according to the method of the examples, adhesive is used to bond the substrates but the adhesive is sometimes leaked out from the jointing part and subjected to cover the nozzle orifice. As the size of the nozzle orifice becomes smaller and those nozzle orifices are more densely arranged, chances of blocking the opening with adhesive increase.

SUMMARY

An advantage of the present invention is to provide a manufacturing method for an ink jet recording head with which jointing of the substrates is not needed and it is possible to prevent the nozzle orifice from being blocked with the adhesive. Another advantage of the invention is to provide an ink jet recording head and an ink jet recording device.

According to a first aspect of the invention, a method for manufacturing an ink jet recording head including a reservoir to which ink is supplied from outside, a pressure generating chamber leading to the reservoir, and a nozzle orifice leading to the pressure generating chamber includes: a) forming a flow channel forming film on a first face side of a substrate having an integrated circuit; b) forming a groove in the flow channel forming film; c) filling the groove with a sacrificial film; d) forming a vibrating film on the sacrificial film and the flow channel forming film; e) forming a piezoelectric element on the vibrating film; f) forming the reservoir by etching the substrate from a second face side of the substrate to an extent where the sacrificial film is exposed; g) removing the sacrificial film through the reservoir; and h) forming the nozzle orifice in the flow channel forming film.

It is preferable that the "sacrificial film" be made of a material that has a higher etching selectivity than that of the "flow channel forming film" (or a film that is more easily etched compared to the flow channel forming film). When the flow channel forming film is made of a silicon oxide ($SiO_2$) film, for example, an amorphous silicon (a-Si) film can be used to form the sacrificial film. When the low channel forming film is made of an a-Si film, a $SiO_2$ film can be used to form the sacrificial film. When the flow channel forming film is a poly-silicon (poly-Si) film, a $SiO_2$ film or a silicon germanium (SiGe) film can be used to make the sacrificial film. The $SiO_2$ film used for the above-mentioned sacrificial film can be a phospho silicate glass (PSG) film whose etching rate is relatively high.

According to a second aspect of the invention, a method for manufacturing an ink jet recording head including a reservoir to which ink is supplied from outside, a pressure generating chamber leading to the reservoir, and a nozzle orifice leading to the pressure generating chamber includes a) forming a first flow channel forming film on a first face side of a substrate that has an integrated circuit, b) forming a first groove in areas of the first flow channel forming film where is going to be a first leading channel that couples the pressure generating chamber and the reservoir, and where is going to be a second leading channel that couples the pressure generating chamber and the nozzle orifice, c) filling the first groove with a first sacrificial film, d) forming a second flow channel forming film on the first flow channel forming film and the first sacrificial film, e) forming a second groove in an area of the second flow channel forming film where is going to be the pressure generating chamber, f) filling the second groove with a second sacrificial film, g) forming a vibrating film on the second sacrificial film and the second flow channel forming film, h) forming a piezoelectric element on the vibrating film, i) forming a reservoir by etching the substrate from a second face side of the substrate to an extent where the first sacrificial film is exposed, j) removing the first sacrificial film and the second sacrificial film through the reservoir, and k) forming the nozzle orifice in the second flow channel forming film.

According to the first and second aspects of the invention, the ink jet recoding head can be fabricated by conducting semiconductor processes (in other words, a film forming step, a photolithography step, an etching step and the like) of a single substrate. Unlike the examples of the related art, the method does not need to joint a plurality of substrates so that the manufacturing process is simplified and it is possible to reduce the manufacturing cost. Moreover, it is not necessary to provide adhesive to joint the substrates so that the nozzle orifice will not be blocked with the adhesive. Thereby it is possible to manufacture the ink jet recoding head at a low cost and high yield ratio.

In this case, the above-described method for manufacturing an ink jet recording head according to the second aspect, the step k) may further include forming the second groove in an area of the second flow channel forming film where is going to be the nozzle orifice, filling the second groove with the second sacrificial film, and removing the second sacrificial film by etching the second sacrificial film through the reservoir after the reservoir is formed. In this way, the pressure generating chamber formation process and the nozzle orifice formation process can be simultaneously performed and it is possible to reduce the number of steps in the manufacturing process of the ink jet recording head.

Moreover, the method for manufacturing an ink jet recording head according to the first aspect of the invention may further include forming the integrated circuit on the first face of the substrate. In the method, a wiring line of the integrated circuit may be made of a high-melting-point metal. In this case, the “high-melting-point metal” is a metal having a melting point of higher than for example 1000° C. and a specific example of such metal includes tungsten (W), tungsten silicide ($WSi_2$), titanium (Ti), titanium silicide ($TiSi_2$), gold (Au), iridium (Ir), molybdenum (Mo) and the like. In this way, it is possible to prevent any troubles such as disconnection due to heat from occurring even though a heat treatment of 700° C. is performed at the time of the piezoelectric fabrication.

Moreover, the above-described method for manufacturing an ink jet recording head may further include forming an insulating protection film on the piezoelectric element. In this way, it is possible to seal the piezoelectric element. In this case, the method may further include forming a first contract hole that reaches to the integrated circuit by etching the flow channel forming film or the second flow channel forming film and the first flow channel forming film, forming a second contact hole that reaches to the piezoelectric element by etching the protection film, filling the first contact hole and the second contact hole by providing a conductive material on the first face of the substrate, and forming a wiring line that couples the integrated circuit and the piezoelectric element electrically by etching the conductive material. In this way, the driver circuit that drives the ink jet recording head can be for example arranged on the first face side of the substrate as an integrated circuit.

According to a third aspect of the invention, an ink jet recording head includes a reservoir to which ink is supplied from outside, a pressure generating chamber leading to the reservoir, a nozzle orifice leading to the pressure generating chamber, a substrate having an integrated circuit and the reservoir, a flow channel forming film provided on a first face side of the substrate and in which the pressure generating chamber and the nozzle orifice are provided, a vibrating film covering the pressure generating chamber and being provided on the flow channel forming film, and a piezoelectric element provided on the vibrating film. In this case, the ink jet recording head may discharge ink that is supplied to the reservoir from the nozzle orifice according to pressure change in the pressure generating chamber. In this way, it is possible to provide an ink jet recording head whose manufacturing process does not need jointing of substrates and in which the nozzle orifice is prevented from being blocked with adhesive.

According to a fourth aspect of the invention, an ink jet recording device includes the above-described ink jet recording head. In this way, it is possible to provide an ink jet recording head whose manufacturing process does not need jointing of substrates and in which the nozzle orifice is prevented from being blocked with adhesive. Such ink jet recoding head can be manufactured at a low cost and high yield ratio. Therefore it is possible to provide the ink jet recording device at a reduced cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
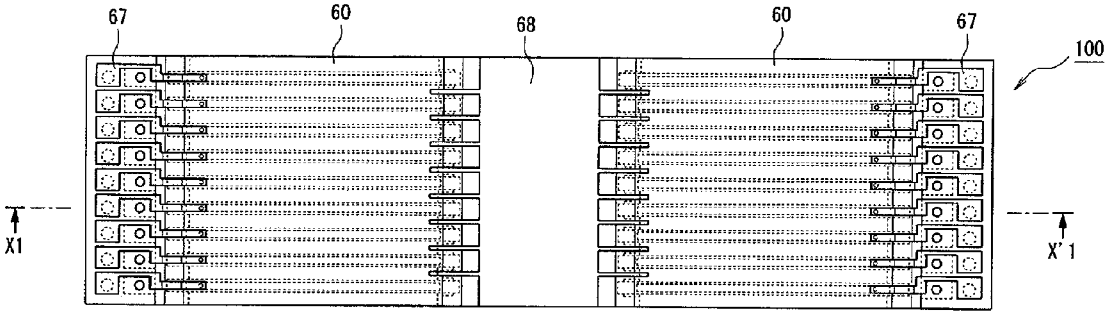
FIG. 1 illustrates a configuration example of an ink jet recording head 100 according to one embodiment of the invention.

Embodiments of the invention will be described. In the following description, the same structures are given the identical numerals in the drawings and those explanations will not be repeatedly given.

Figure 1B:
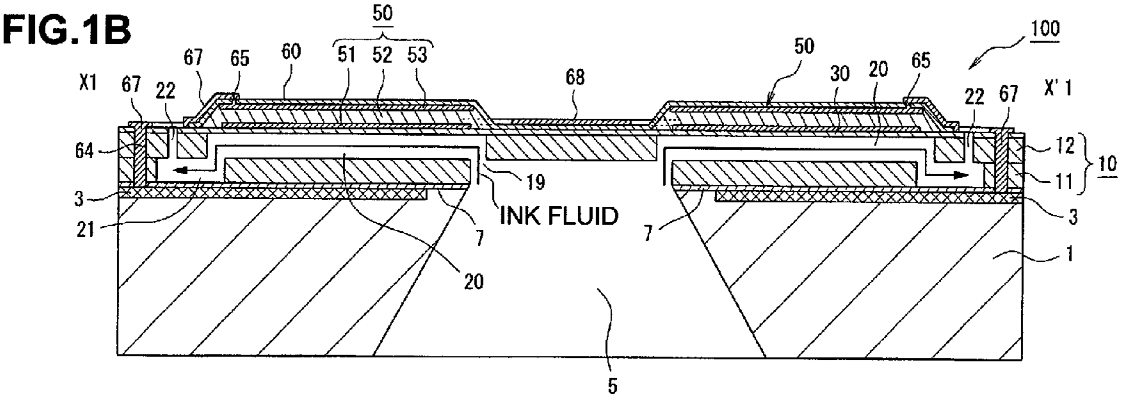

FIG. 1 illustrates a configuration example of an ink jet recording head 100 according to an embodiment of the invention. FIG. 1A is a plan view of the ink jet recording head, FIG. 1B is a sectional view along the line X1-X'1 in FIG. 1A. Referring to FIG. 1A and FIG. 1B, the ink jet recording head 100 includes for example a substrate 1, a flow channel forming film 10, a vibrating film 30, and a piezoelectric element 50 (or piezo-element).

The substrate 1 is for example a bulk-silicon substrate having a plane orientation (100). A driver circuit 3 that drives the piezoelectric element 50 is provided on a front face (the upper face in FIG. 1B) of the substrate 1 so as to form a single body with the substrate. The substrate 1 further has a through hole. A diameter of the opening of the through hole gradually decreases from a back face (the lower face in FIG. 1B) towards the front face of the substrate. This through hole serves as a reservoir 5 to which ink is supplied from outside. The capacity of the reservoir 5 is sufficiently larger than the total capacity of a hereunder described pressure generating chamber 20. Moreover, a passivation film 7 that protects the driver circuit 3 is provided on the front face of the substrate 1.

The flow channel forming film 10 is provided on the front face side of the substrate 1. The flow channel forming film 10 for example has a multilayered structure that includes a first flow channel forming film 11 which is provided closer to the substrate 1 and a second flow channel forming film 12 which is provided on top of the first film. Ink flow channels, each of which is separately provided, are formed in the above-mentioned flow channel forming film 10. Here, the ink flow channel means a passage in which ink flows and includes an ink leading channel 19, the pressure generating chamber 20, a nozzle leading channel 21 and a nozzle orifice 22. Referring to FIG. 1B, the ink leading channel 19 leads to the reservoir 5 and with the pressure generating chamber 20, and ink flows therebetween through the channel. The nozzle leading channel 21 leads to the pressure generating chamber 20 and with the nozzle orifice 22, and ink flows between them through the channel. The capacity of the pressure generating chamber 20 and the size of the nozzle orifice 22 are appropriately decided depending on conditions such as an ink discharging amount, a discharging speed and a discharging frequency.

A first contact hole 64 is formed in the flow channel forming film 10 and the passivation film 7 underneath. A bottom face of the contact hole is a pad electrode or the like which is provided on a front face (or an active face) of the driver circuit 3. Moreover, the vibrating film 30 is provided on the flow channel forming film 10. The vibrating film 30 is an elastic film and formed on the flow channel forming film 10 so as to cover the pressure generating chamber 20. The piezoelectric element 50 is provided right above the pressure generating chamber 20 with the vibrating film 30 interposed therebetween. Referring to FIG. 1B, the piezoelectric element 50 includes a lower electrode 51, a piezoelectric body 52 which is disposed on the lower electrode 51, and an upper electrode 53 which is disposed on the piezoelectric body 52. The lower electrode 51 is for example a common electrode which is coupled to a plurality of piezoelectric elements 50. The piezoelectric body 52 is a dielectric material that lengthens and contracts or distorts when a voltage is applied, and such material includes for example piezoelectric zirconate titanate (PZT). Unlike the lower electrode 51 which is a common electrode, the upper electrode 53 is an individual electrode which is provided in one-to-one correspondence to the piezoelectric. The piezoelectric element 50 having the above-described structure is disposed right above each pressure generating chamber 20.

A protection film 60 is disposed on the front face side of the substrate 1 so as to cover the piezoelectric element 50. A second contact hole 65 is provided in the protection film 60. The second contact hole 65 is bottomed with the upper electrode 53. A wiring line 67 is provided so as to fill the second contact hole 65 and the first contact hole 64 that is formed in the flow channel forming film 10 and the passivation film 7. The wiring line 67 couples each upper electrode 53 of the piezoelectric element 50 with the driver circuit 3. The lower electrode 51 of the piezoelectric element 50 is coupled with a wiring line 68 that extends over the protection film 60.

In the above-described ink jet recording head 100, ink is supplied into the reservoir 5 from an unshown outside ink supply means. As denoted by the arrow in the drawing, the space extending from the reservoir 5 to the nozzle orifice 22 is filled with the ink. The piezoelectric body 52 lengthens and contracts or distorts when a voltage is applied between the upper electrode 53 and the lower electrode 51 of the piezoelectric element 50 according to a recording signal supplied from the driver circuit 3. The vibrating film 30 is deformed by the piezoelectric element 50, which increase the pressure inside the pressure generating chamber 20 and a ink droplet is discharged from the nozzle orifice 22.

A method for manufacturing the ink jet recording head 100 is now described. FIGS. 2 through 8 illustrate a method for manufacturing the ink jet recording head 100 according to another embodiment of the invention. FIGS. 2A to 8A are sectional views of the recording head, and FIGS. 2B to 8B are sectional views along the line X-X' in the corresponding FIGS. 2A to 8A.

Figure 2A:
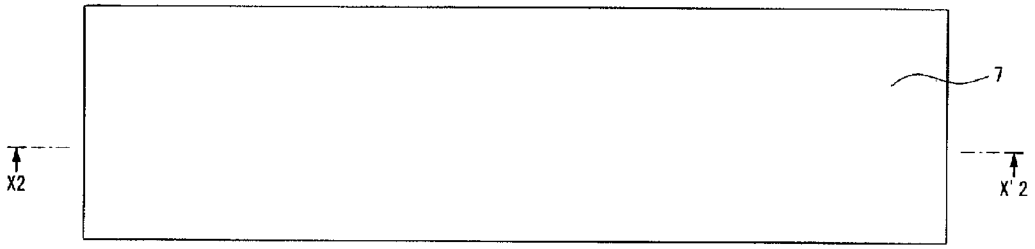
FIG. 2 is a first drawing that describes a method for manufacturing the ink jet recording head 100.
Figure 2B:
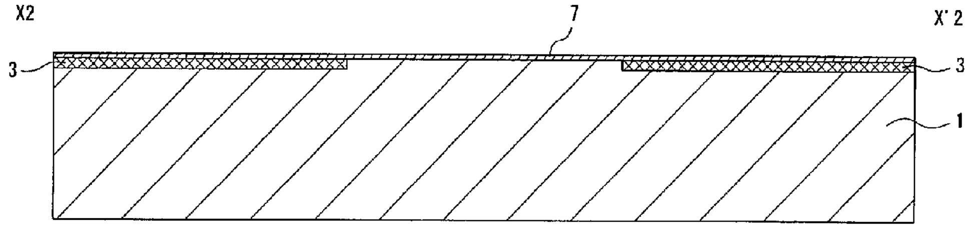

Referring to FIG. 2A and FIG. 2B, the driver circuit 3 that drives the piezoelectric element 50 is provided on the front face side of the substrate 1. The driver circuit 3 is formed through a semiconductor fabrication process. It is preferable that wiring lines (including a wiring line coupling transistors and the like, and a pad electrode which is a wiring line disposed in a top layer) provided inside the driver circuit 3 be formed of a high-melting-point metal such as W, $WSi_2$, Ti and $TiSi_2$ rather than a low-melting-point metal such as aluminum (Al). This is because a heating process in which a temperature reaches as high as about 700° C. is conducted in a hereinafter-described piezoelectric film fabrication process. When the wiring lines inside the driver circuit 3 are formed of a metal having a melting point of for example higher than 1000° C., it is possible to prevent any troubles such as disconnection due to heat from occurring even though the heating process of 700° C. is performed later on.

Subsequently, the passivation film 7 is formed over the front face of the substrate 1 so as to cover the driver circuit 3. The passivation film 7 is made of for example a $SiO_2$ film, a silicon nitride ($Si_3N_4$) film or the like, and is fabricated through for example a chemical vapor deposition (CVD) process.

Figure 3A:
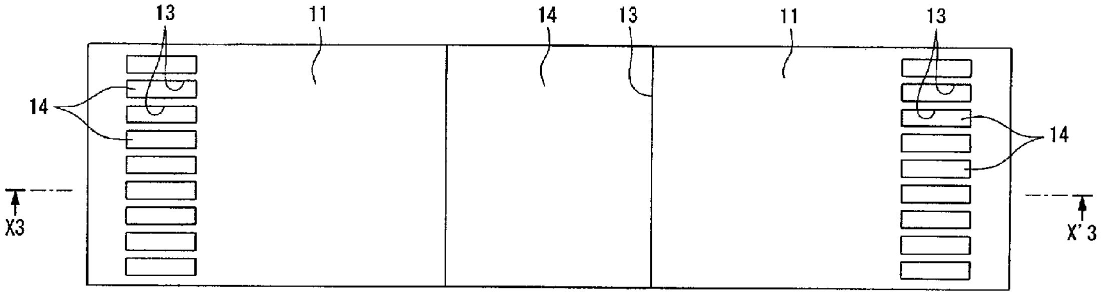
FIG. 3 is a second drawing that describes the method for manufacturing the ink jet recording head 100.
Figure 3B:
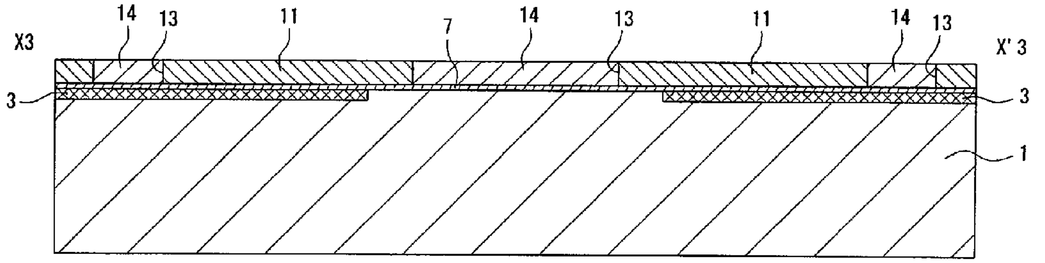

Referring to FIG. 3A and FIG. 3B, the first flow channel forming film 11 is formed on the passivation film 7. A thickness of the first flow channel forming film 11 is for example 10 to 100 μm and its fabrication process can be conducted by for example CVD. The first flow channel forming film 11 is then etched by using a photolithography method and an etching technique so as to form a first groove 13 that is provided in the plural number at positions corresponding to for example the ink leading channel 19 (see FIG. 1), the nozzle leading channel 21 (see FIG. 1) and the nozzle orifice 22 (see FIG. 1).

The first groove 13 is then filled up with a first sacrificial film 14. More specifically, for example, the first sacrificial film 14 is provided so as to blanket the surface of the substrate 1 and the first groove 13 is plugged up. A thickness of the first sacrificial film 14 is for example substantially the same as or larger than the depth of the first groove 13. The first sacrificial film 14 is then leveled by for example chemical mechanical polish (CMP) so as to remove the first sacrificial film 14 which is formed in areas other than the first groove 13. In this way, it is possible to leave the first sacrificial film 14 only inside the first groove 13.

Figure 4A:
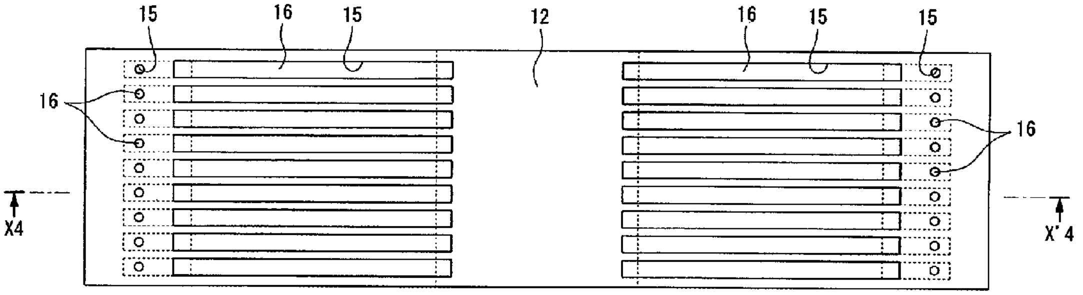
FIG. 4 is a third drawing that describes the method for manufacturing the ink jet recording head 100.
Figure 4B:
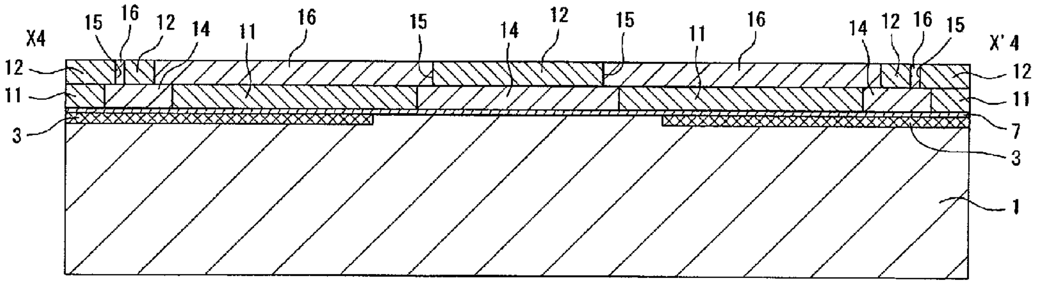

Referring to FIG. 4A and FIG. 4B, the second flow channel forming film 12 is formed on the first flow channel forming film 11 and the first sacrificial film 14. The second flow channel forming film 12 is formed in for example 10 to 100 μm thick by CVD. The second flow channel forming film 12 is then etched partially by using a photolithography method and an etching technique so as to form a second groove 15 that is provided in the plural number at positions corresponding to for example the pressure generating chamber 20 (see FIG. 1) and the nozzle orifice 22 (see FIG. 1). The second groove 15 is provided so as to be connected with the first groove 13. More specifically, the end part of the second groove 15 is disposed on the end part of the first groove 13. In this way, a groove having the first groove 13 and the second groove 15 that leads to the first groove 13 is formed.

Referring to FIG. 4A and FIG. 4B, the second groove 15 is then filled up with a second sacrificial film 16. More specifically, for example, the second sacrificial film 16 is provided so as to blanket the surface of the substrate 1 and the second groove 15 is plugged up. A thickness of the second sacrificial film 16 is for example substantially the same as or larger than the depth of the second groove 15. The second sacrificial film 16 is then leveled by for example CMP so as to remove the second sacrificial film 16 which is formed in areas other than the second groove 15. In this way, it is possible to leave the second sacrificial film 16 only inside the second groove 15.

The first sacrificial film 14 and the second sacrificial film 16 (hereinafter referred simply "the sacrificial film") are removed after the reservoir 5 (see FIG. 1) is formed. Therefore it is preferable that the sacrificial films 14, 15 be made of films having a higher etching selectivity than the first flow channel forming film 11 and the second flow channel forming film 12 (or the flow channel forming film 10). In other words, a film that is more easily etched compared to the flow channel forming film 10 is preferably used for the sacrificial films. When the flow channel forming film 10 is a $SiO_2$ film, for example, an a-Si film can be used to form the sacrificial films 14, 16. When the flow channel forming film 10 is an a-Si film, a $SiO_2$ film can be used for the sacrificial films 14, 16. When the flow channel forming film 10 is a poly-Si film, a $SiO_2$ film or a SiGe film can be used to make the sacrificial films 14, 16. The $SiO_2$ film used for the above-mentioned sacrificial film can be a phospho silicate glass (PSG) film.

The method for fabricating the sacrificial films 14, 15 is not limited the above-described method (more specifically, the method including the film forming process by CVD and the leveling process by CMP). The sacrificial films 14, 16 can also be fabricated by a so-called gas deposition method or jet molding method in which ultrafine particles having a diameter of smaller than 1 μm are collide with the substrate 1 at a high speed by pressure of a gas such as helium (He). According to such method, the first groove 13 and the second groove 15 can be filled up with the sacrificial films 14, 16 without performing the leveling process by CMP.

Figure 5A:
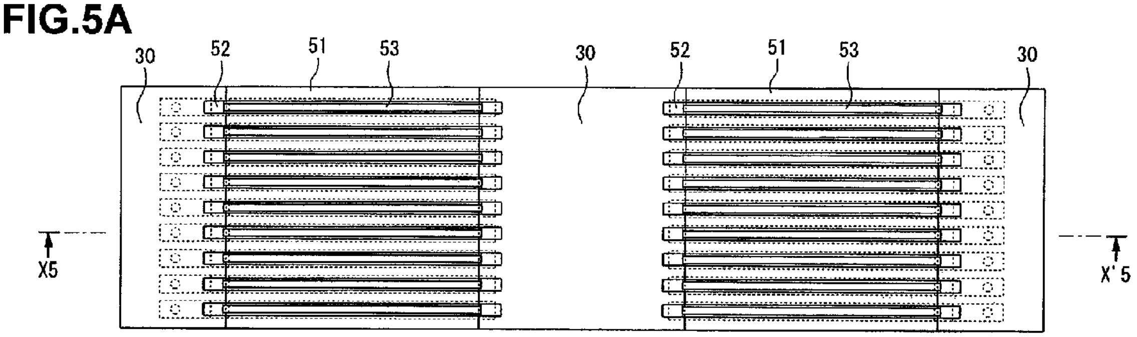
FIG. 5 is a fourth drawing that describes the method for manufacturing the ink jet recording head 100.
Figure 5B:
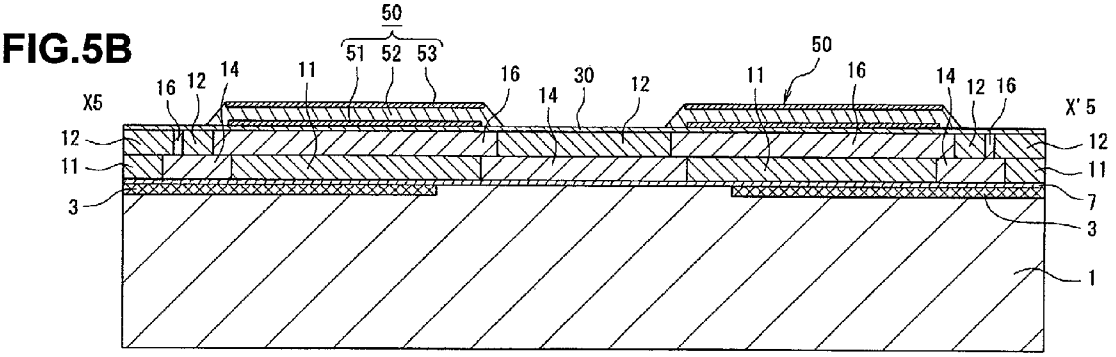

Referring to FIG. 5A and FIG. 5B, the vibrating film 30 is formed on the second flow channel forming film 12 and the second sacrificial film 16. As described above, the vibrating film 30 is an elastic film such as an $SiO_2$ film, a zirconium oxide ($ZrO_2$) or a multilayered film of these films. The thickness of the vibrating film is for example 1 to 2 μm. When the vibrating film 30 is made of $ZrO_2$, zirconium (Zr) is sputtered (reactive sputtering) by using plasma containing $O_2$ to form the $ZrO_2$ film. Material for the vibrating film 30 is not particularly limited. However it is preferable to use a material which is not etched or less etched in the process of forming the reservoir 5 (see FIG. 1) and in the process of removing the sacrificial films 14, 16.

Referring to FIG. 5A and FIG. 5B again, the piezoelectric element 50 is formed on the vibrating film 30 corresponding to each pressure generating chamber 20. The lower electrode film is formed on the vibrating film 30 by for example sputtering. Platinum (Pt), iridium (Ir) or the like is appropriately adopted to form the lower electrode film. This is because the hereunder-described piezoelectric film which is formed by a sputtering method or a sol-gel method needs to be crystallized through a baking process at a temperature of 600 to 1000° C. in atmospheric air or oxygen atmosphere after the film formation. Therefore the lower electrode film needs to be formed of a selected material that can retain conductivity even under such high temperature oxygen atmosphere. Particularly when the piezoelectric film is made of piezoelectric zirconate titanate (PZT), it is preferable that a material whose conductivity change due to a diffusion of lead oxide is relatively small be selected for the lower electrode film. A specific example of such material includes Pt, Ir and the like. A part of the lower electrode film is subsequently etched by photolithography and etching so as to obtain the lower electrode 51 that has a shape of the common electrode. The piezoelectric film is then provided. The piezoelectric film is formed by for example applying a "sol" in which an organic metal compound is solved or dispersed in a catalyst, drying the applied sol to turn it into "gel", and then sinter the gel at a high temperature (this fabrication process is called the "sol-gel" method). A piezoelectric zirconate titanate (PZT) series material is preferably used to form the piezoelectric film and its sinter temperature is for example about 700° C. The method for forming the piezoelectric film is not limited to the sol-gel method but encompasses a sputtering method, a spin coating method such as a metal organic deposition (MOD) and the like. Moreover, the piezoelectric film can be formed in a different way such that a precursor film of the PZT is provided by a sol-gel method, a sputtering method, a MOD method or the like, then low-temperature crystal growth is conducted by a high-pressure processing method in an alkaline solution. A thickness of the piezoelectric film formed by such method is for example 0.2 to 5 μm.

The upper electrode film is subsequently formed. The upper electrode film is be made of a material having a high conductivity. Such material can be metals including aluminum (Al), gold (Au), nickel (Ni), platinum (Pt) and the like, conductive oxides, or the like. The upper electrode film and the piezoelectric film are sequentially etched partially by photolithography and etching so as to obtain the upper electrode 53 and the piezoelectric body 52 having prescribed figures. Through the steps described above, the piezoelectric element 50 including the lower electrode 51, the piezoelectric body 52 and the upper electrode 53 is provided on the vibrating film 30. Though the lower electrode 51 is made as the common electrode for the piezoelectric elements 50, and the upper electrode 53 is made as the individual electrode of the piezoelectric element 50 in the above-described embodiment, these electrodes can be made as the opposite role depending on conditions of the driver circuit 3 and wirings. In other words, the lower electrode 51 can serve as the individual electrode and the upper electrode 53 can serve as the common electrode.

Figure 6A:
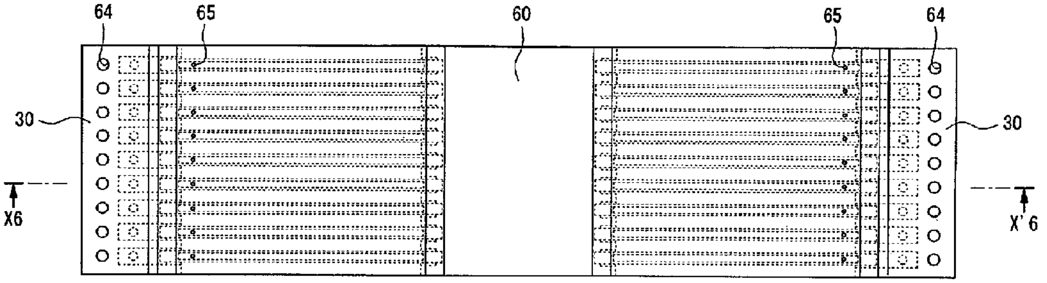
FIG. 6 is a fifth drawing that describes the method for manufacturing the ink jet recording head 100.
Figure 6B:
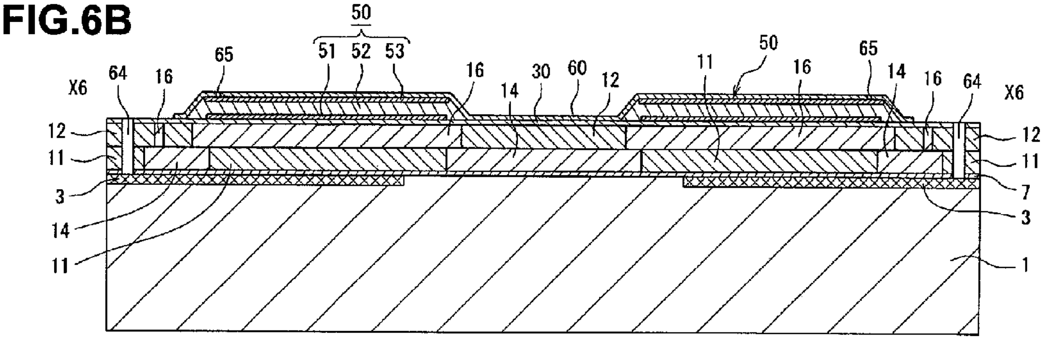

Referring to FIG. 6A and FIG. 6B, the protection film 60 is formed over the whole surface of the vibrating film 30 on which the piezoelectric element 50 has been formed. The protection film 60 is made of for example alumina ($Al_2O_3$) and can be formed by a sputtering method, atomic layer deposition (ALD), or metal organic chemical vapor deposition (MOCVD). Subsequently, a part of the protection film 60, the vibrating film 30 and the flow channel forming film 10 are sequentially etched by using a photolithography and etching technique and the first contact hole 64 is formed. The second contact hole 65 is also formed and provided on the upper electrode 53 in the same manner before/after or simultaneously with the formation of the first contact hole 64.

Figure 7A:
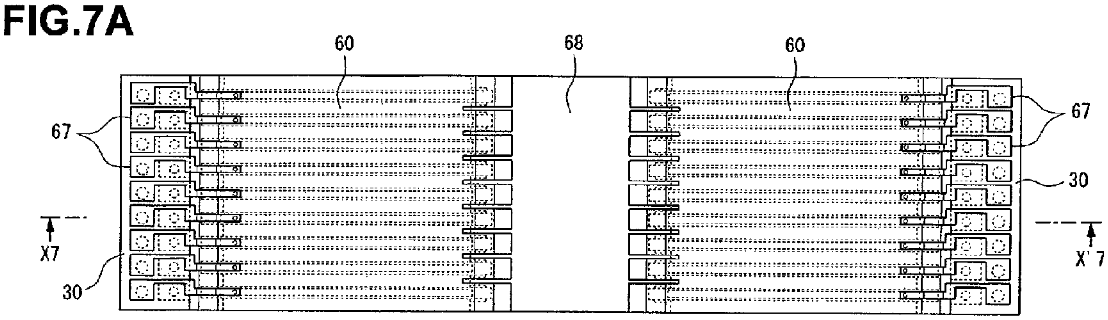
FIG. 7 is a sixth drawing that describes the method for manufacturing the ink jet recording head 100.
Figure 7B:
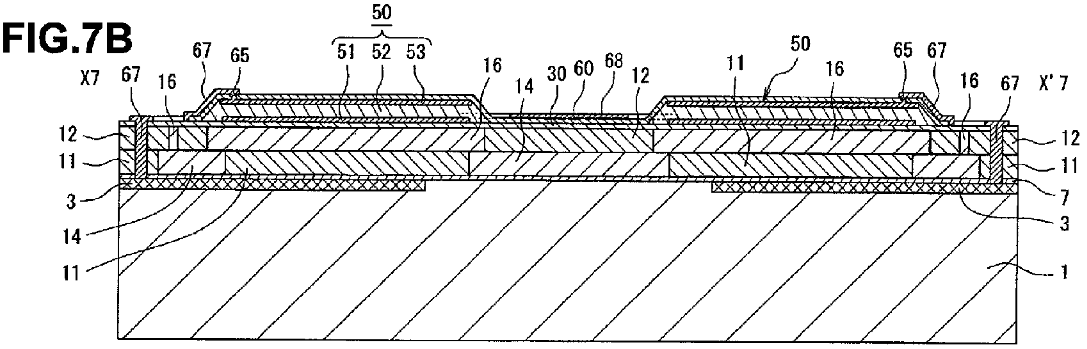

The first contact hole 64 and the second contact hole 65 are then filled up by providing a conductive film over the whole front face of the substrate 1. Subsequently the conductive film is partially etched by photolithography and etching. In this way, the wiring line 67 that couples the upper electrode 53 of the piezoelectric element 50 to the driver circuit 3 electrically is formed as shown in FIG. 7A and FIG. 7B. At the same time, the wiring line 68 that is coupled to the lower electrode 51 which is the common electrode and extened over the protection film 60 is also formed.

Figure 8A:
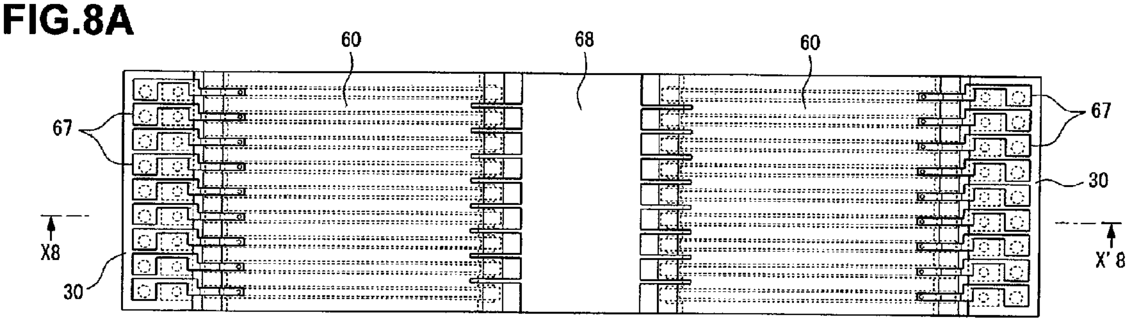
FIG. 8 is a seventh drawing that describes the method for manufacturing the ink jet recording head 100.
Figure 8B:
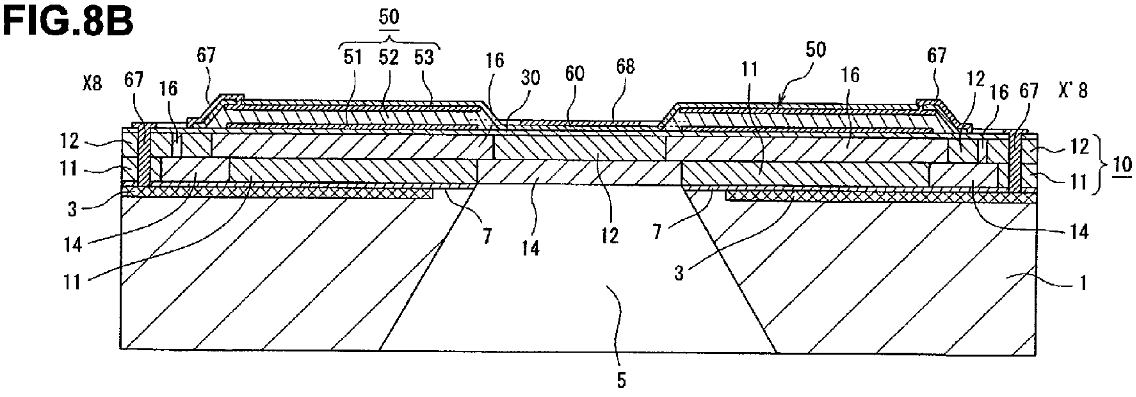

Referring to FIG. 8A and FIG. 8B, the reservoir 5 is formed by partially etching the substrate 1 from it's back face side by using a photolithography and etching technique. More specifically, the substrate 1 is wet-etched by using for example a potassium hydroxide (KOH) solution. The reservoir 5 is formed such that its diameter gradually decreases through an anisotropic wet-etching using KOH, and a (111) plane is exposed on its lateral face.

The reservoir 5 can be formed through other methods such as dry-etching instead of the wet-etching. Though the reservoir 5 is formed after the piezoelectric element 50 is provided according to the above embodiment, the order of the reservoir formation is not particularly limited to this. The reservoir 5 can be formed at any timing in the manufacturing process of the ink jet head.

The passivation film 7 that is exposed at the bottom of the reservoir 5 is subsequently removed by etching. When the passivation film 7 is for example a $SiO_2$ film, the passivation film 7 is removed by wet-etching using a hydrofluoric acid (HF) solution or dry-etching. When the passivation film 7 is a $Si_3N_4$ film, the passivation film 7 is removed by wet-etching using a hot phosphoric acid solution or dry-etching. Consequently the first sacrificial film 14 is exposed at the bottom face of the reservoir 5.

The first sacrificial film 14 and the second sacrificial film 16 are then etched through the reservoir 5. The first sacrificial film 14 and the second sacrificial film 16 are completely removed, and a space surrounded by the flow channel forming film 10 and the vibrating film 30, which is the ink flow channel, is formed. When the etching of the sacrificial films 14, 16 can be performed by either dry-etching or wet-etching, an etching gas or etchant whose etching speed is larger than that of the flow channel forming film 10 is used to etch the sacrificial films 14, 16. When the flow channel forming film 10 is for example a $SiO_2$ film and the sacrificial films 14, 16 is an a-Si film, a xenon fluoride ($XeF_2$) gas can be used as the etching gas.

When the flow channel forming film 10 is an a-Si film or poly-Si film and the sacrificial films 14, 16 is a PSG film, a HF solution can be used as the etchant. By selecting the etching conditions adequately, it is possible to etch and remove the sacrificial films 14, 16 selectively while controlling the etching of the flow channel forming film 10 an at the same time. The vibrating film 30 is partially etched by photolithography and etching and the nozzle orifice 22 is formed. Through the above-described processes, the ink jet recording head 100 as shown in FIG. 1A and FIG. 1B is completed.

According to the embodiment, the ink jet recoding head can be fabricated by conducting semiconductor processes (in other words, a film forming step, a photolithography step, an etching step and the like) of a single substrate 1. Unlike the examples of the related art, the method according to the embodiment does not need to joint a plurality of substrates so that the manufacturing process is simplified and it is possible to reduce the manufacturing cost. Moreover, it is not necessary to provide adhesive to joint the substrates so that the nozzle orifice 22 will not be blocked with the adhesive. Thereby it is possible to manufacture the ink jet recoding head at a low cost and high yield ratio. Furthermore, when such ink jet recording head is mounted on an ink jet recording device, it is possible to provide the ink jet recording device at a reduced cost.

In the above-described embodiments, the front face of the substrate 1 corresponds to a "first face", the back face of the substrate 1 corresponds to a "second face" and the driver circuit 3 corresponds to an "integrated circuit (IC)" in the invention. The ink leading channel 19 corresponds to a "first leading channel", and the nozzle leading channel 21 corresponds to a "second leading channel". Moreover, the first sacrificial film 14 and the second sacrificial film 16 correspond to a "sacrificial film", and the first groove 13 and the second groove 15 corresponds to a "groove" in the invention.

Figure 9:
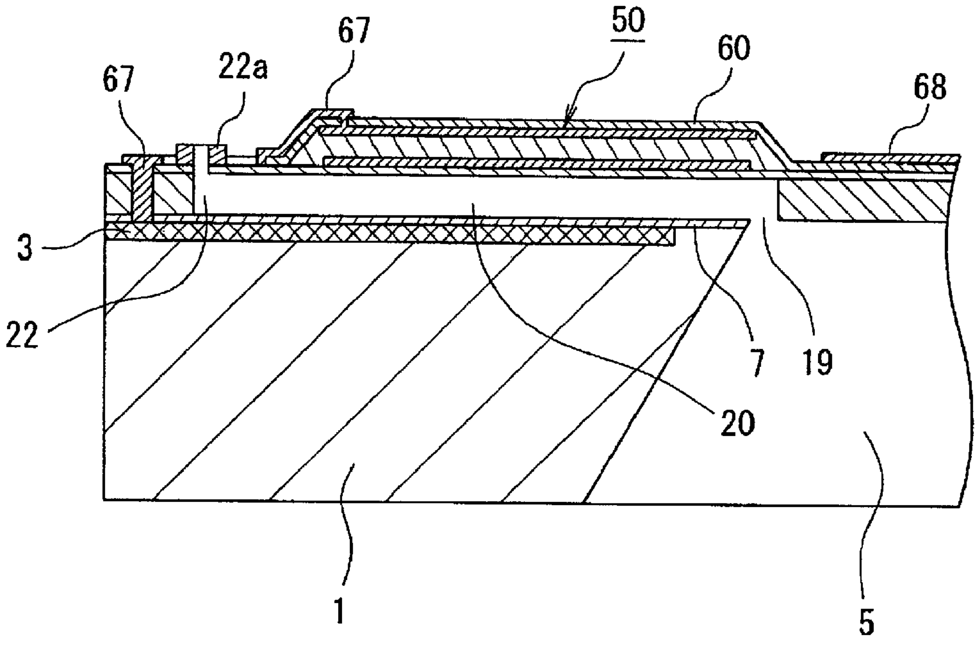
FIG. 9 shows another configuration example of the ink jet recording head 100.
Figure 10A:
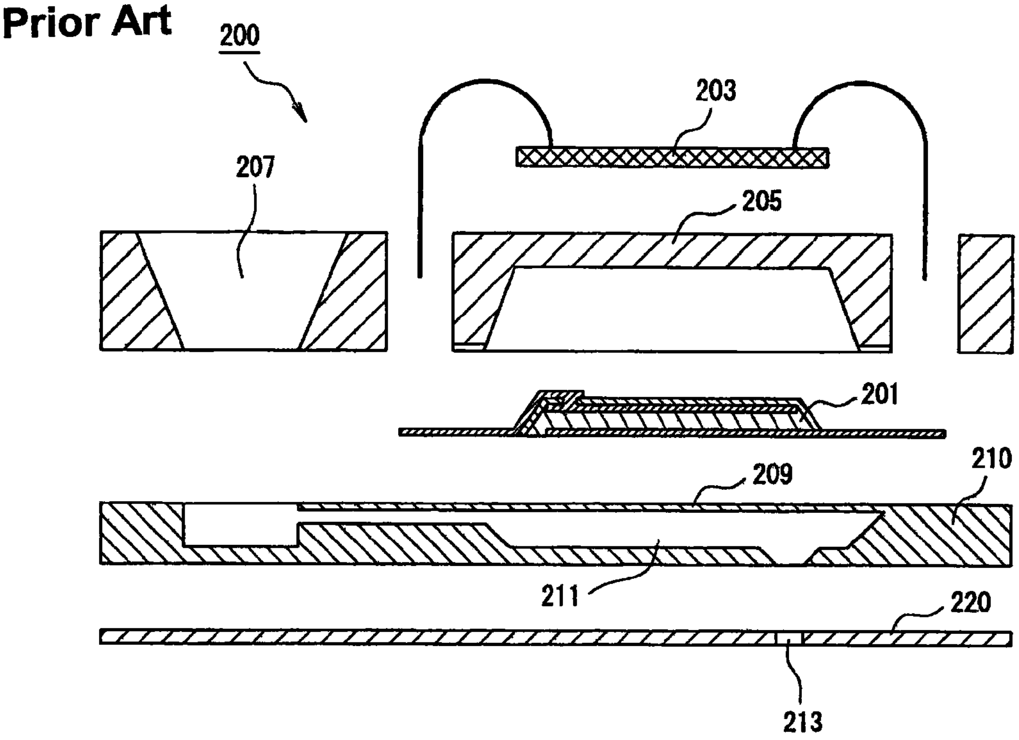
FIG.10A Prior Art
FIG. 10 shows an example of the related art.
Figure 10B:
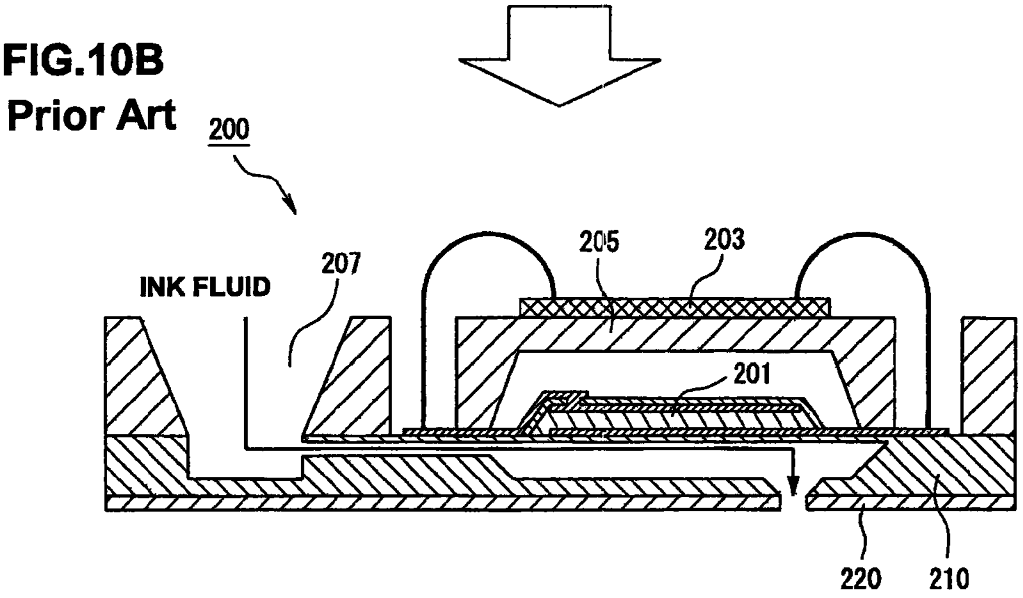
FIG.10B Prior Art

Though the flow channel forming film 10 has the double-layered structure (including the first flow channel forming film 11 and the second flow channel forming film 12) in the above-described embodiments, the structure is not limited to this. The flow channel forming film 10 can have a single layer structure as illustrated in FIG. 9. Even in this case, it is possible to form the ink flow channel in the flow channel forming film 10 in the same manner described in the above embodiments. When the flow channel forming film 10 has the single layer structure, there is a possibility that the nozzle orifice 22 is distorted by the lengthening and contraction motion of the piezoelectric element 50. To prevent this form happening, referring to FIG. 9, an adapter 22*a* is preferably provided at the opening of the nozzle orifice 22 when the flow channel forming film 10 has the single layer structure. The adapter 22*a* is made of for example a $SiO_2$ film or a $Si_3N_4$ film. The nozzle orifice 22 part is made thicker with the adapter so that the orifice is less distorted and it becomes possible to stabilize the ink discharging directions.

The entire disclosure of Japanese Patent Application No. 2008-076376, filed Mar. 24, 2008 is expressly incorporated by reference herein.

What is claimed is:

1. A method for manufacturing an ink jet recording head including a reservoir to which ink is supplied from outside, a pressure generating chamber leading to the reservoir, and a nozzle orifice leading to the pressure generating chamber, the method comprising:

a) forming a flow channel forming film on a first face side of a substrate having an integrated circuit;
b) forming a groove in the flow channel forming film;
c) filling the groove with a sacrificial film;
d) forming a vibrating film on the sacrificial film and the flow channel forming film;
e) forming a piezoelectric element on the vibrating film;
f) forming the reservoir by etching the substrate from a second face side of the substrate to an extent where the sacrificial film is exposed;
g) removing the sacrificial film through the reservoir; and
h) forming the nozzle orifice in the flow channel forming film.

2. A method for manufacturing an ink jet recording head including a reservoir to which ink is supplied from outside, a pressure generating chamber leading to the reservoir, and a nozzle orifice leading to the pressure generating chamber, the method, comprising:

a) forming a first flow channel forming film on a first face side of a substrate having an integrated circuit;
b) forming a first groove in areas of the first flow channel forming film where is going to be a first leading channel that couples the pressure generating chamber and the reservoir, and where is going to be a second leading channel that couples the pressure generating chamber and the nozzle orifice;
c) filling the first groove with a first sacrificial film;
d) forming a second flow channel forming film on the first flow channel forming film and the first sacrificial film;
e) forming a second groove in an area of the second flow channel forming film where is going to be the pressure generating chamber;
f) filling the second groove with a second sacrificial film;
g) forming a vibrating film on the second sacrificial film and the second flow channel forming film;
h) forming a piezoelectric element on the vibrating film;
i) forming a reservoir by etching the substrate from a second face side of the substrate to an extent where the first sacrificial film is exposed;
j) removing the first sacrificial film and the second sacrificial film through the reservoir; and
k) forming the nozzle orifice in the second flow channel forming film.

3. The method for manufacturing an ink jet recording head according to claim 2, the step k) further comprising:

forming the second groove in an area of the second flow channel forming film where is going to be the nozzle orifice;

filling the second groove with the second sacrificial film; and removing the second sacrificial film by etching the second sacrificial film through the reservoir after the reservoir is formed.

4. The method for manufacturing an ink jet recording head according to claim 1, further comprising:

forming the integrated circuit on the first face of the substrate, wherein a wiring line of the integrated circuit is made of a high-melting-point metal.

5. The method for manufacturing an ink jet recording head according to claim 1, further comprising:

forming an insulating protection film on the piezoelectric element.

6. The method for manufacturing an ink jet recording head according to claim 5, further comprising:

forming a first contract hole that reaches to the integrated circuit by etching the flow channel forming film or the second flow channel forming film and the first flow channel forming film;

forming a second contact hole that reaches to the piezoelectric element by etching the protection film;

filling the first contact hole and the second contact hole by providing a conductive material on the first face of the substrate; and forming a wiring line that couples the integrated circuit and the piezoelectric element electrically by etching the conductive material.

* * * * *